United States Patent
Lutz

[11] Patent Number: 5,606,201
[45] Date of Patent: Feb. 25, 1997

[54] FLUID-COOLED POWER TRANSISTOR ARRANGEMENT

[75] Inventor: Dieter Lutz, Schweinfurt, Germany

[73] Assignee: Mannesmann Aktiengesellschaft, Düsseldorf, Germany

[21] Appl. No.: 341,556
[22] PCT Filed: May 24, 1993
[86] PCT No.: PCT/DE93/00465
  § 371 Date: Nov. 23, 1994
  § 102(e) Date: Nov. 23, 1994
[87] PCT Pub. No.: WO93/24955
  PCT Pub. Date: Dec. 9, 1993

[30] Foreign Application Priority Data
  May 25, 1992 [DE] Germany .................... 42 17 289.6

[51] Int. Cl.[6] .................................................. H01L 23/34
[52] U.S. Cl. ........................... 257/714; 257/721; 257/723
[58] Field of Search ........................... 257/714, 721, 257/723; 361/691

[56] References Cited
U.S. PATENT DOCUMENTS 4,296,455  10/1981  Leaycraft et al. ................ 257/721
5,077,601  12/1991  Hatada et al. ..................... 257/714
5,262,921  11/1993  Lamars ............................. 257/714

Primary Examiner—Mahshid Saadat
Assistant Examiner—Roy Potter
Attorney, Agent, or Firm—Cohen, Pontani, Lieberman, Pavane

[57] ABSTRACT

The proposal is for a fluid-cooled power transistor arrangement, the semiconductor component (1) of which is arranged on an especially boardlike insulating substrate (9) via a metal electrode (7). The flat side of the semiconductor component (1) away from the insulating substrate (9) and/or the side of the insulating substrate (9) away from the semiconductor component (9) is in direct heat-exchange contact with a forced flow of cooling fluid in a coolant channel (13). Here, the insulating substrate (1) or the semiconductor component (1) may form wall regions of the coolant channel (13). In order to improve the heat transfer, the wall regions to be cooled and in contact with the cooling fluid may have a surface microstructure which reduces the boundary layer thickness of the coolant flow. The improvement in the cooling action reduces the structural space required so that the electrical valves may be fitted in the immediate vicinity of the electric device to be switched. This is of special advantage in electric motors in order to reduce line inductance. The electric motor and the electric valves are advantageously cooled by the same cooling circuit.

34 Claims, 3 Drawing Sheets

FLUID-COOLED POWER TRANSISTOR ARRANGEMENT

BACKGROUND OF THE INVENTION

1. Field of the Invention

The invention relates generally to the field of fluid cooling of semiconductor components and in particular to a fluid-cooled power transistor arrangement.

2. Description of the Prior Art

In order to control electric devices and machines, semiconductor valves are used in great numbers. The type of valve to be used is determined, first of all, by the quantity of power to be controlled and, secondly, by the maximum operating frequency. Thyristors and triacs are used at network frequencies, i.e., on the order of 50 Hz, and permit power control to on the order of 10 megawatts. In many application cases, however, especially in the control of electric machines, higher switching frequencies up to nearly the megahertz range are required. For applications of this type, power transistors are used. In the frequency range around 10 kHz at powers on the order of between 10 and 100 kW, BIMOS power transistors and IGBT (Insulated Gate Bipolar Transistor) power transistors are used. Moving toward higher frequencies, but at lower powers, MOSFET power transistors are normally used.

Power semiconductor components must be cooled. In the active region of the semiconductor component, temperatures should not rise above relatively low temperature values. The waste heat passing through not only the semiconductor substrate, but also the electrode platings and the multi-layer supporting plates on which the semiconductor substrate is located must be eliminated. In power transistors of the type discussed above, the semiconductor substrate has, on at least one of its sides, a base metal plating which overlaps in planar fashion the entire active region of the substrate and, depending on the type, forms the collector or the drain electrode. The other electrodes of the transistor, i.e., the base electrode and emitter or the gate or source electrode, are accessible on the opposite flat side of the semiconductor substrate. In conventional power transistors, a fluid-cooled heat sink arrangement is attached to the flat base metal plating and dissipates the waste heat of the active region of the transistor through the semiconductor substrate and the base metal plating. Because the temperature in the active region must be maintained uniformly within the given limit values, it is vital that the heat sink arrangement be attached to the semiconductor substrate of the semiconductor element flatly and with uniform heat exchange characteristics. As a rule, a direct connection of the heat sink to the semiconductor substrate is not possible in view of the high voltages (1000 V and more) and high currents (e.g. 100 amperes), which means that the semiconductor substrate must be arranged on an insulating substrate via which, in previous power transistor arrangements, the waste heat has had to be dissipated from the semiconductor component into the cooling arrangement. It is therefore common to place the semiconductor component on a ceramic board which has copper plating on both sides and to solder the ceramic board by its side away from the semiconductor component onto a supporting plate of for example, steel. In turn, the steel plate is placed with an intermediate layer of a heat conducting paste onto the, for example, water-cooled cooling element. Suitable heat sink arrangements are known, for example, from EP-A-447 835. However, it has been shown that the switching capacity of power transistors often cannot be fully utilized or that malfunctions of power transistors occur if inhomogeneities, which can lead to local overheating of the semiconductor component and thus to the destruction of the transistor, remain in the solder layer connecting the ceramic board to the steel plate or in the heat conducting paste layer.

In order to improve the cooling effectiveness of power transistors, a method is known of providing the supply bands attached to the side away from the substrate with heat sinks, which strengthen the cooling of the active region of the semiconductor component (EP-A-252 429 and EP-A-449 435). In addition, a method is known (EP-A-260 370) of attaching a heat sink equipped with cooling ribs in a material-tight fashion to the flat side of the semiconductor component away from the active area and exposing the cooling ribs to a cooling air flow.

Finally, a method is known from DE-A-41 01 205 of arranging the boardlike semiconductor component of a power diode or a power thyristor in a coolant channel and contacting it on both sides by flexible contact brushes. Each contact brush consists of a multiplicity of wire pieces, individually parallel to one another, which are cooled by the cooling fluid flowing along the semiconductor component. However, the contact brushes do not permit any surface heat dissipation, as would be required for cooling the semiconductor element of a power transistor. In DE-A-41 01 205, it is suggested that the cooling fluid be water, air, oil or a cooling agent with hydrocarbon content.

SUMMARY OF THE INVENTION

The object of the invention is to create a fluid-cooled power transistor arrangement in which the uniform cooling of the semiconductor component of the power transistor arrangement is provided for more reliably than in the past.

The invention starts from a fluid-cooled power transistor arrangement, especially for electric valve arrangements, which includes:

- a boardlike transistor semiconductor component which carries on the first of its flat sides a metal electrode connected to the semiconductor component in closed-surface and material-tight fashion and covering the entire flat side, and on its second flat side carries a plurality of terminals attached to the semiconductor element at a distance from one another and in a material-tight manner;
- an electrically insulating substrate projecting over the semiconductor element in the direction of the first flat side, on which the semiconductor element is held by its first side toward the insulating substrate; and
- a fluid cooling arrangement with a coolant channel and a means to produce a forced flow of a cooling fluid in the coolant channel, which is in direct heat exchange contact with at least one of the flat sides of the semiconductor element.

Starting from such a power transistor arrangement, the above mentioned object is attained according to the present invention by virtue of the fact

- that the control and protective wiring for the semiconductor component is also arranged on the insulating substrate; and
- that the insulating substrate and/or the semiconductor component is exposed directly with at least one of its flat sides to the forced cooling fluid flow in the coolant channel, whereby the contact with the cooling fluid essentially occurs over the entire surface of the flat side.

The invention is based on the idea of omitting the supporting plates found in conventional power transistors for the attachment to the heat sink, except for the insulating substrate required for operation, and of instead exposing at least one flat side, preferably the insulating substrate and, in certain cases, the semiconductor component in the region of its metal electrode, to the cooling fluid directly and, to the extent possible, over its entire flat-side surface. In addition, the semiconductor component, in certain cases provided with a thin protective coating, may also be exposed to the cooling fluid on the side away from the insulating substrate. The metal electrode should be connected to the insulating substrate in a material-tight manner and preferably in a full-surface fashion. It should, in its superficial extent, exceed the area of the semiconductor component as clearly as possible, and should preferably be at least 50% larger than the flat side of the semiconductor component. The metal electrode here being assigned another important function along with its electric function, since it must not only quickly absorb and pass along the heat which arises, but must also distribute it in the surface. In this way, a uniform cooling of the semiconductor element can be achieved, because material-tight connections between material layers which follow one after the other, for example, of supporting plates or the like, are kept to a minimum. The coolant may be a gas, preferably a gas under pressure, e.g., nitrogen, or a liquid, e.g., water or oil, particularly a mineral-base oil or a paraffin-base oil or a synthetic oil; however, the coolant may also be a two-phase fluid, preferably a cooling agent or $CO_2$.

The arrangement of the control and protective wiring for the semiconductor element on the same insulating substrate results in a series of advantages. Not only does thermal coupling of the involved components take place, but the separate cooling of the control and protective wiring becomes unnecessary. The required connecting lines are minimized, which helps to promote reliability. Only a small number of connecting lines lead outward.

The invention is especially suitable for IGBT power transistors; however, it can also switch for MOSFET power transistors, which can switch powers in the range of 100 kW and greater at high operating frequencies and, in particular, currents of 5 to 100 A at voltages of 100 to 1000 V.

As has previously been the case, the insulating substrate is used for the attachment of the semiconductor component. The insulating substrate may be a supporting plate of insulating material, particularly ceramics, on which the semiconductor component is placed with its metal electrode in a closed-surface, material-tight manner. Alternatively, however, the insulating substrate may also be designed as a metal plate provided on at least one flat side with an insulating layer, e.g., a metal plate with an insulating oxide layer. The last-mentioned embodiment is advantageous particularly because the metal plate may at the same time integrally form the metal electrode.

The semiconductor component may be completely arranged in the coolant channel, so that the coolant flows by in a cooling manner both on the side of the insulating substrate advantageously designed as a plate and on the side of the semiconductor component away from the insulating substrate. In a preferred embodiment with a boardlike insulating substrate, however, the insulating substrate forms a wall of the coolant channel. This design is especially advantageous when the insulating substrate carries together a plurality of semiconductor components arranged one behind the other, because in this way a plurality of electric valves can be built up in modular fashion, for example, in the form of one or more half-bridges or full bridges. Especially simple solutions are achieved when at least two walls of the coolant channel located opposite to one another are formed by boardlike insulating substrates, each of which carries at least one semiconductor component. In order to achieve uniform cooling and thermal expansion, the two insulating substrates located opposite to one another preferably carry an equal number of semiconductor components. In the simplest design, it suffices for the insulating substrates located opposite to one another to be connected by sealing strips to a coolant channel closed in the circumferential direction.

In the designs described above, in which the insulating substrates form walls of the coolant channel, the semiconductor components may be arranged on the inner side of the coolant channel or on the outer side, whereby the latter design has the advantage of being easier to connect.

In conventional power transistors, the usually boardlike insulating substrate overlaps the semiconductor component in a closed-surface fashion. In a preferred embodiment of the invention, it is possible for the insulating substrate, in contrast to insulating substrates of conventional power transistors, to also be designed so that it overlaps with the semiconductor component only partially, preferably just to that extent which allows the semiconductor component to be securely attached to the insulating substrate. This has the advantage that the flat side of the semiconductor component, which is provided with the metal electrode, can be directly exposed to the flow of the coolant without the interpositioning of the insulating substrate. The walls of the coolant channel are here used as an insulating substrate. The insulating substrate, which in turn may be a plate of insulating material, is advantageously provided with a continuous recess, on the edges of which the semiconductor component is mounted and through which the semiconductor component is exposed, at least with its first flat side, to the flow of coolant. In particular, the insulating substrate may also have side walls of the coolant channel which run at a right angle to the first flat side of the semiconductor component, e.g., in a form in which the insulating substrate, at least in the area of the recess, has an essentially U-shaped cross-section, so that the semiconductor component rests upon the edges of the prongs formed by the U-shaped cross-section and, all told, a coolant channel with a roughly rectangular cross-section is formed.

Naturally, in the embodiment in which the insulating substrate only partially overlaps the flat sides of the semiconductor component, several of the semiconductor components could also be grouped together on a common insulating substrate into a module. This may be done, for example, in that the insulating substrate is designed as a profile body which carries at least one or more semiconductor components arranged one behind the other in the flow direction of the coolant, each of which semiconductor components includes at least one power transistor. The insulating substrate used to form the coolant channel may, along with the side walls of the coolant channel running at a right angle to the semiconductor component, also form portions of the walls which run on the plane of the semiconductor component.

In the embodiment discussed above, each of the semiconductor components may be mounted on the profile body by itself and separately from the others. However, after semiconductor components have been manufactured in relatively large numbers on a common semiconductor substrate according to conventional manufacturing processes, a preferred embodiment calls for a plurality of semiconductor components connected to one another as one piece are mounted on each profile body. This makes it easier to seal off the coolant channel.

An especially simple embodiment, in which a plurality of semiconductor components may be grouped together into a module, calls for each of at least two walls of the coolant channel located opposite to one another to essentially be formed completely of at least one semiconductor component, and for the semiconductor components located opposite to one another to be connected by sealing strips to a coolant channel closed in the circumferential direction. The sealing strips may be formed by walls, the height of which may, in given cases, exceed the width of the semiconductor component; however, the sealing strips may also be comparatively flat strips.

The coolant flow is a forced flow, in order to ensure an adequate heat transport. In order to prevent dirtying or contamination of the semiconductor component or the insulating substrate, the fluid cooling arrangement advantageously includes a closed cooling fluid circuit, wherein the cooling fluid circulates in turn through the coolant channel and a cooler, i.e., a heat exchanger which gives off heat towards the outside. If a two-phase fluid is used as the coolant, the cooling fluid circuit preferably includes a vaporizer and a condenser, whereby the coolant channel forms the vaporizer. Such an arrangement, working in the manner of a heat pump, allows adequate cooling even at a lower fluid flow.

Particularly in insulating substrates that are connected to the semiconductor component in a full-surface fashion, cooling effectiveness can be increased if the insulating substrate, on the side away from the semiconductor element and exposed to the coolant flow, is provided with a structure that enlarges its heat exchange area, in particular, with ribs or projections. To the extent that the above discussion refers to boardlike insulating substrates, structures of this sort are to be included in each case.

The use of ribs or the like in order to enlarge the heat exchange areas in cooling arrangements, such as, for example, heat sinks or the like, is known. In a second aspect, the invention relates to measures through which the cooling performance of the fluid cooling arrangement may be increased. Such a fluid cooling arrangement not only may be used in a power transistor arrangement of the type discussed above, but is suitable generally for cooling semiconductor components, including in certain cases those with indirect cooling via a fluid-cooled cooling body. According to the second aspect of the invention, at least one part of the wall surface of the coolant channel that is exposed to the coolant flow, or, in a power transistor arrangement according to the type discussed above, at least one portion of the surface of the insulating substrate or of the semiconductor component, has a surface microstructure which reduces the thickness of the boundary layer of the coolant flow. Here the invention starts from the consideration that the slighter the thickness of the coolant flow boundary layer is, within which the coolant flow is called for and braked on shear, the greater the cooling effect of the coolant flow will be. Surprisingly, it has been shown that microstructures which reduce surface friction lead to an improvement in the cooling effect of a coolant flow, because they reduce the boundary layer thickness. Microstructures that reduce the friction of fluids on surfaces are known and have been studied, among other ways, on the skin of sharks (D. Bechert and M. Bartenwerfer, "The Viscous Flow on Surfaces with Longitudinal Ribs," J. Fluidmec. 1989, Vol. 206, pp. 105 to 129, and D. Bechert, B. Hoppe, "On the Drag Reduction of the Shark Skin," AIAA Share Flow Control Conference, Mar. 12–14, 1985, Boulder, Colo.).

It has been shown that microstructures in the form of a rib pattern with essentially parallel microribs extending lengthwise in the flow direction of the coolant flow are especially suitable for improving cooling effectiveness, particularly when the microribs have tops which taper at least approximately to a blade edge. The height of the ribs and their spacing is advantageously on the order of the boundary layer thickness or is less than the boundary layer thickness. The cooling fluid is advantageously a one-material system.

BRIEF DESCRIPTION OF THE DRAWINGS

In what follows, examples of the invention are discussed in greater detail in reference to the drawings.

DETAILED DESCRIPTION OF THE EMBODIMENTS

Figure 1:
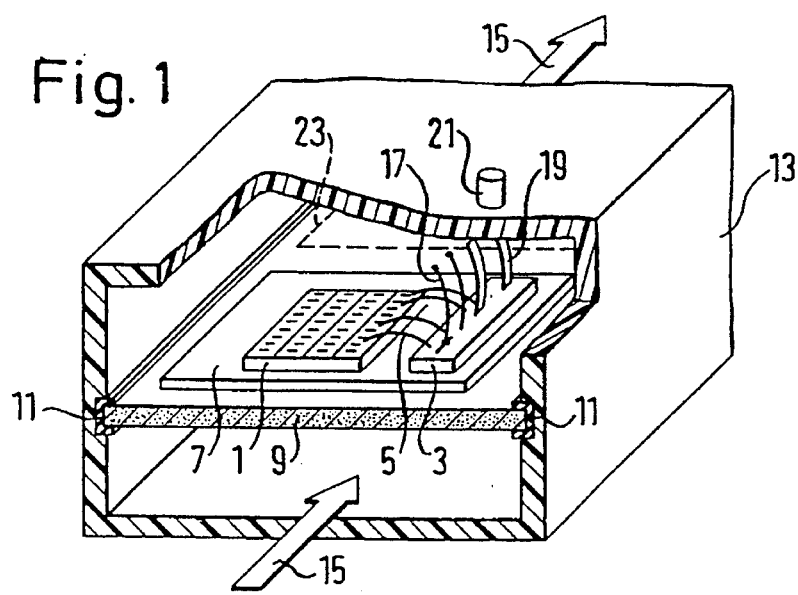
FIG. 1 is a partially sectioned depiction in perspective of a fluid-cooled power transistor arrangement.

FIG. 1, in which the thickness relationships of the individual components are not true to scale, shows a power transistor module, namely an IGBT module, with a first chip or semiconductor component 1, which has a transistor circuit including a plurality of power transistors, as well as a second chip or semiconductor component 3, which contains the control electronics and protective wiring for the power transistors and is connected via connecting lines 5 to the first semiconductor component 1. The semiconductor components 1, 3 are rigidly connected in a material-tight fashion to, for example, an eutectically-produced metal plating 7, particularly one consisting of copper. The metal plating 7 forms the collector of the power transistors of the semiconductor component 1 and is connected both to the semiconductor component 1 and to a ceramic insulating board 9 in a material-tight, planar and homogeneous manner. The insulating board 9 is partially held by the edges in tracks 11 of a coolant channel 13 closed in the circumferential direction, in particular, so that both the flat side of the semiconductor component 1 away from the insulating board 9 as well as the flat side of the insulating board 9 away from the semiconductor component 1 are exposed to a coolant flow, indicated by arrow 15. Control lines 17 designed as thin wires and current bars 19 designed as copper bands connect the circuits of the semiconductor components 1, 3 to the terminals 21 arranged on the outer side of the coolant channel 13. In respect to heat transmission, of the two semiconductor components at least the semiconductor component 1 is essentially exposed directly to the coolant flow 15, so that it is cooled on both sides in a full-area manner. In this way, a high power density can be achieved despite compact dimensions. Because the metal plating 7 remains as the sole intermediate layer between the semiconductor component 1 and the insulating plate 9 a homogeneous, material-tight connection can be achieved with sufficient reliability between the semiconductor component I and the insulating plate 9, benefitting the temperature stability and operating reliability of the IGBT module. The tracks 11 are preferably executed elastically and in an insulating fashion (e.g., made of an elastomer).

In the coolant channel 13, a plurality of IGBT modules can be arranged in the flow direction 15, one behind the other and on a common insulating plate, as indicated at 23. Naturally, the cooling fluid does not need to circulate through the coolant channel 13 on both sides of the insulating plate 9. In individual cases, it may be sufficient for a cooling fluid to flow between the insulating plate 9 and the coolant channel 13 solely on the side away from the semiconductor components 1, 3. Alternatively, it is also possible for only the portion of the coolant channel 13 which covers the semiconductor 1, 3 to be available and/or utilized for the coolant flow. Of course, it is also possible to implement the semiconductor components 1,3 with other types of power transistor, instead of IGBT modules. For example, bipolar power transistors or MOSFET power transistors with or without driving stages or protective wiring can be used. In addition, the control circuit on the semiconductor 3 may, in certain cases, be replaced by an external electronics circuit.

Figure 2:
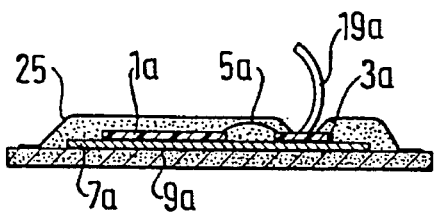
FIGS. 2–4 are sectional views of variants of the power transistor arrangement as in FIG. 1.

FIG. 2 shows a variant of the IGBT module that is distinguished from the structure in FIG. 1 only by the fact that the boardlike semiconductor components 1a, 3a, which are mounted over the metallization 7a in a material-tight and full-area manner on the ceramic insulating board 9a are coated, except for the contact sites of the control lines and/or the contact bands 19a, with a thin protective layer 25, which protects the active region of the semiconductor components 1a, 3a against contamination by the coolant. The protective layer 25 may, for example, be a coating of silicone rubber, which is covered by a metal foil from the outside. For the sake of providing further explanation, reference is made both here and in the example described below to the previous drawings and their descriptions, with the same reference numbers plus a distinguishing letter of the alphabet being used to designate components having the same function.

Figure 3:
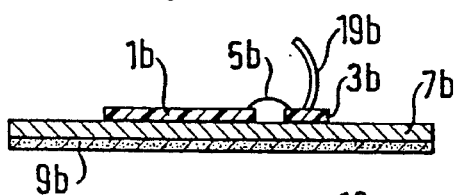

FIG. 3 shows a variant of an IGBT module, the semiconductor components 1b, 3b of which are mounted on a metal plate 7b, which corresponds in respect to function to the metallization 7, e.g., a copper plate, in a closed-surface and material-tight manner. The metal plate 7b is outside the region of the semiconductor components 1b, 3b; however, at least on the flat side away from the semiconductor components 1b, 3b there is an insulating layer, for example, a thin oxide layer 9b. The metal plate 7b performs, in addition to the electrode function, the attachment function of the insulating plate 9 from FIG. 1.

Figure 4:
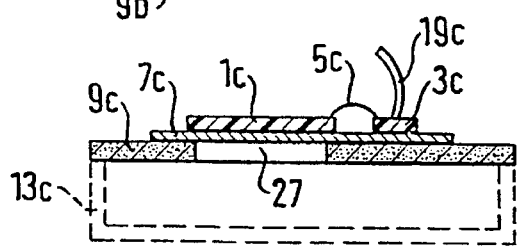

FIG. 4 shows a variant in which the semiconductor elements 1c, 3c are arranged in a full-area manner on a metallization 7c, which has, at the same time, an electrode function. The insulating plate 9c, in contrast, has a continuous recess 27, which is overlapped at least by the semiconductor component 1c that contains the power transistors, through which the cooling fluid may come directly into heat exchange contact with the metallization 7c and thus with the semiconductor component 1c, which facilitates the elimination of waste heat. Essentially, the recess 27 overlaps the semiconductor component 1c completely. The semiconductor 1c rests upon the insulating plate 9c solely in the edge region of the recess 27. As indicated in FIG. 4 by the broken line 13c, the coolant channel together with the insulating plate 9c may also take the form of a profile tube 13c, here possibly a one-part rectangular pipe, on which the semiconductor components 1c, 3c may be mounted subsequently from the outside. Naturally, coolant channel constructions of this type may also be used in the variants from FIG. 1 to 3.

Figure 5:
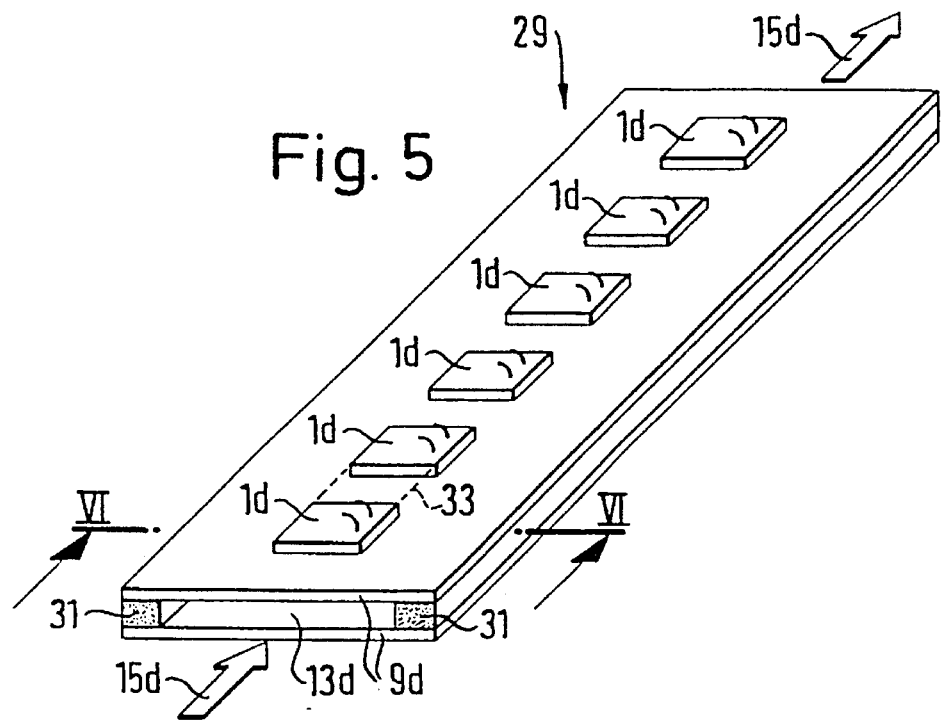
FIG. 5 is a depiction in perspective of a fluid-cooled module with a plurality of power transistors.
Figure 6:
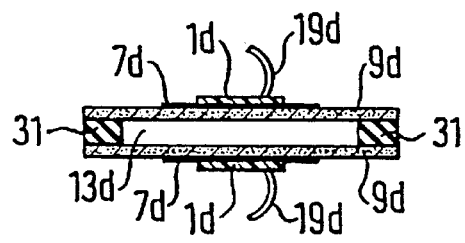
FIG. 6 is a sectional view of the module seen along a Line VI—VI in FIG. 5.

FIG. 5 shows an example which permits multiple IGBT modules, each of which, as in the example discussed above, forms an electric valve, to be grouped together into valve modules, particularly in the form of half-bridges or full bridges, partly in parallel or serial connection, and as applicable, a plurality of these bridges. The module designated generally by 29 includes two parallel insulating plates 9d consisting of a ceramic material, which are connected along their longitudinal edges by, preferably elastic, sealing strips 31 from the coolant channel 13d closed in the circumferential direction. In turn, arrow 15d indicates the flow direction of the cooling fluid. Each of the two insulating plates 9d carries on its flat side away from the coolant channel a plurality of semiconductor components 1d arranged one behind the other in the flow direction 15d, each of which constitutes a separate IGBT valve. The number of semiconductor components 1d on each of the two insulating boards 9d is the same. As can be seen in FIG. 6, the semiconductor components 1 d are in turn placed via metallizations 7d upon the insulating plates 9d in a full-area and form-fitting manner. The terminals are shown at 19d. As in FIGS. 6 to 8, the protective and control circuits for the IGBT modules are not depicted separately. Naturally, the variants in FIGS. 2 to 4 may also be used in the module 29.

In FIG. 5, the semiconductor components 1 d of each valve are arranged separately and at a distance from one another on the insulating plates 9. Because semiconductor components of the type under discussion are usually produced repeatedly in the same form next to one another on semiconductor substrate wafers, it is also possible in certain cases for a plurality of semiconductor components 1d to be connected as one piece to one another, as indicated at 33 in FIG. 5.

Figure 7:
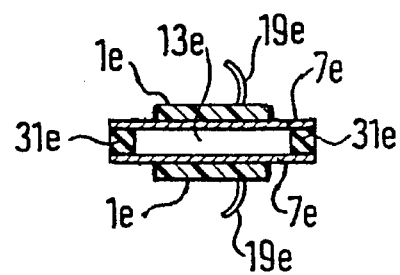
FIG. 7 is a sectional view of a variant of the module from FIG. 5.

FIG. 7 shows another variant, which builds upon the integrally-connected semiconductor components 1e. The semiconductor elements 1e of multiple electric valves are cut out together from the aforementioned substrate wafer and provided with a metallization (metal electrode 7e). The metal electrodes 7e have an electrically insulating layer on the side toward the cooling fluid. The semiconductor component plates 1e are arranged parallel to one another and connected to one another via sealing separation strips 31e. Together with the separation strips 31e, the semiconductor component boards 13 form the boundary of a coolant channel 13e closed in the circumferential direction. The terminals of the electric valves are indicated at 19e.

Figure 8:
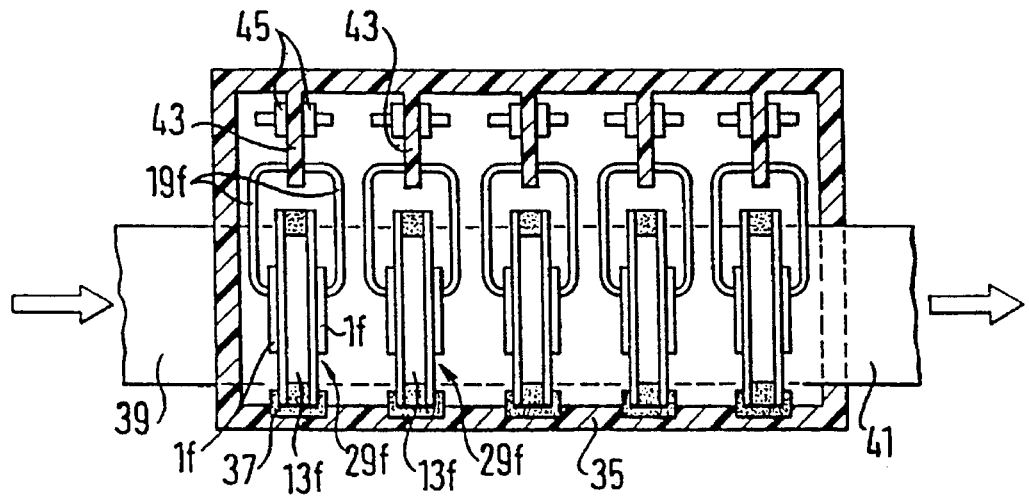
FIG. 8 is a sectional view of a component consisting of a plurality of modules.

FIG. 8 shows in schematic fashion how a plurality of the modules 29 as in FIG. 5 to 7 may be combined into a unit. The modules 29f are held parallel to one another in elastic tracks 37 in a shared housing 35. Their coolant channel 13f is connected at one end to a shared cooling fluid supply channel 39 and at the other end to a shared cooling fluid withdrawal channel 41. The modules 29f have associated with them support elements 43 arranged on the module plane, which are provided with attachment organs 45. The attachment organs 45 serve for the attachment of the control lines and the current bars and are, as indicated by the lines 19f, connected to the semiconductor components If of the modules 29f.

The cooling fluid may be a gas under atmospheric overpressure, e.g., nitrogen, or a fluid, e.g., water, or an oil, particularly a mineral-base oil or a paraffin-basis oil or a synthetic oil. However, two-phase fluids are also suitable, e.g., cooling agents or $CO_2$. The cooling fluid is circulated in a forced flow through the coolant channel.

Figure 9:
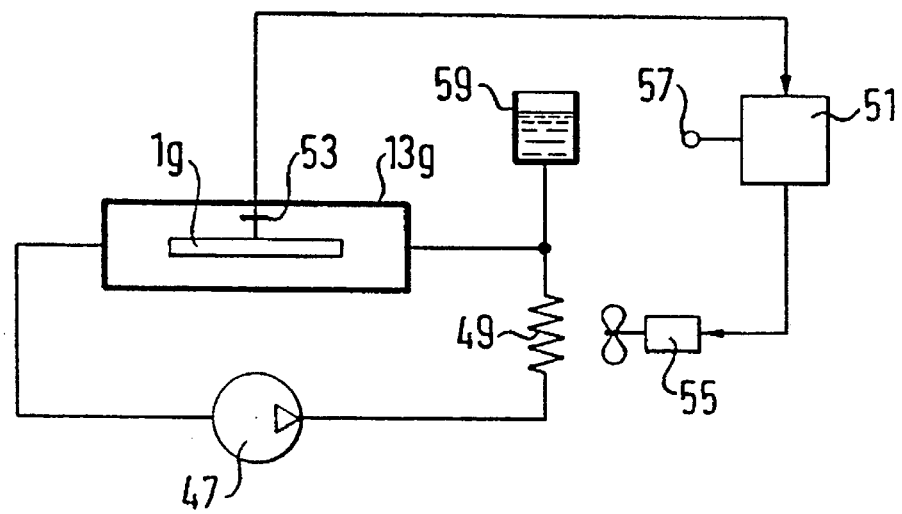
FIG. 9 is a schematic depiction of a fluid-cooling arrangement for a power transistor.
Figure 10:
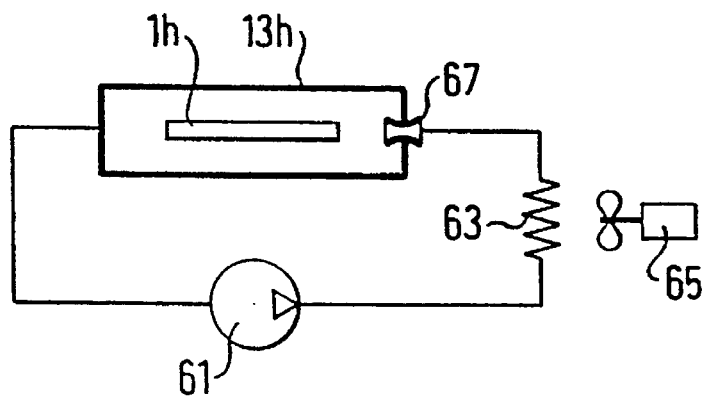
FIG. 10 is a schematic depiction of a cooling-agent cooling arrangement for a power transistor.

FIG. 9 shows an example of a cooling arrangement with a liquid as the coolant. The coolant is fed by a pump 47 via a cooler or heat exchanger 49 to the coolant channel 13g. The cooling arrangement includes a temperature control system 51, which measures the temperature of the semiconductor component (indicated at 1g) in heat exchange contact with the cooling fluid by means of a temperature sensor 53 and, for example, by means of a ventilator 55, influences the cooling effectiveness of the cooler 49, and holds the semiconductor temperature at a target value settable at 57. For the sake of completeness, a compensation vessel for the cooling fluid is indicated at 59. FIG. 10 shows a variant in which a two-phase cooling agent is used in order to cool the semiconductor component 1h. Depending on the type of heat pump, the cooling agent compressed by a compressor 61 in a condenser 63, for example, by means of a ventilator 65, is cooled and liquified. The cooling channel 13h forms a vaporizer in which the fluid cooling agent is introduced via a nozzle 67 or something similar and is evaporated through thermal absorption. The use of a cooling agent as the coolant permits a more compact construction of the cooling arrangement.

Figure 11:
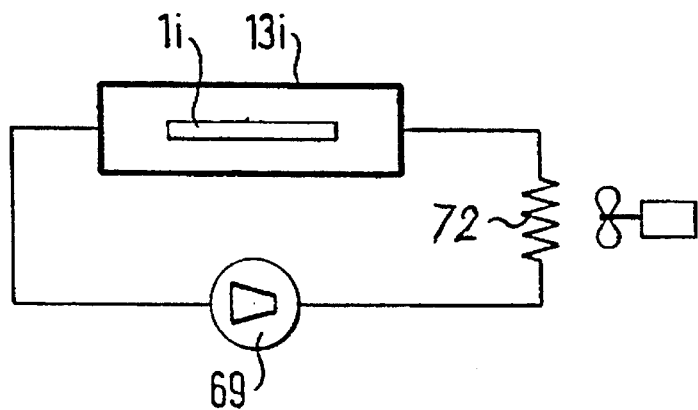
FIG. 11 is a schematic depiction of a cooling arrangement with gaseous coolant for a power transistor.

For the sake of completeness, FIG. 11 shows a closed cooling agent circuit for a gaseous coolant, which is compressed by a compressor 69 before subsequently being cooled in a cooler or heat exchanger 72 and then supplied to the coolant channel 13i for heat exchange contact with the semiconductor component 1i. Naturally, the variants in FIGS. 10 and 11 also can be executed in a temperature-controlled fashion.

The heat transfer from the surfaces of the semiconductor components to be cooled and/or the metal platings and insulating plates connected in closed-surface and material-tight fashion to the semiconductor components can be improved, particularly when a fluid is used as the coolant, by means of surface microstructures which reduce the boundary layer thickness of the coolant. The boundary layer is the area of the coolant flow in which the flow rate is reduced by friction and fluid adhesion to the wall surface. It has been shown that "sharkskin"-like surface structures not only reduce fluid friction on the wall surface, but also reduce the thickness of the boundary layer. As the boundary layer thickness is reduced, so is the distance between the surfaces emitting waste heat and the flowing areas of the coolant absorbing the heat.

Figure 12:
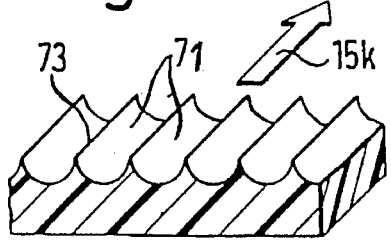
FIG. 12 is a depiction in perspective of a surface microstructure for improving the cooling performance of a fluid-cooled electric valve.

FIG. 12 shows a example of this type of surface microstructure which reduces the boundary layer thickness. The microstructure consists of a great number of ribs 71 running parallel to one another in the flow direction 15k of the coolant, the side flanks of which taper in wedge fashion to a bladelike top 73. The ribs 71 merge into one another in concavely curved grooves. The height of the ribs and their distance from one another is preferably smaller than the boundary layer thickness.

The rib form shown in FIG. 12 has proved advantageous; however, other rib forms are also useful, for example, ribs, with rounded tops or trapezoid-form ribs and the like.

Figure 13:
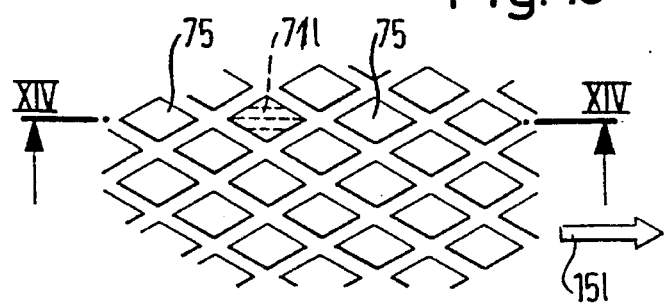
FIG. 13 is a variant of the surface microstructure.
Figure 14:
FIG. 14 is a sectional view through the surface microstructure, seen along the Line XIV—XIV from FIG. 13.

Other surface structures which reduce the boundary layer are shown in FIGS. 13 and 14. These figures show a top view of diamond-shaped knobs or elevations 75, which rise in wedgelike fashion in the flow direction 15l of the coolant along planes running vertical to the surface to be cooled. The roofage surfaces formed by the elevations 75 may be even or may be provided with microribs similar to what is shown in FIG. 12, as indicated at 71l. Instead of the diamond-shaped profile shown in a top view in FIG. 13, the elevations 75 may also have other, generally polygonal profiles. Those which are suitable include, among others, triangular shapes which point with one of their corners in the flow direction 15l. In the example of FIGS. 13 and 14 the dimensions of the elevations 75 are also on the order of the boundary layer thickness.

A significant advantage of valve structures according to the invention lies in the fact that due to the overall improvement in cooling the space requirement can be reduced. The electric valves can thus be housed better than before in the spatial vicinity to the electric devices to be controlled. This is of special advantage in the case of electric machines, for example, electric motors or electric generators, with field windings to be switched by electric valves, because the field windings may be connected via very short leads. By shortening the leads, line inductance may be reduced and thus the response time of the electric valve may be shortened.

I claim:

1. A fluid-cooled IGBT, MOSFET or BIMOS power transistor arrangement for electric valve arrangements, comprising: a board-like transistor semiconductor component having flat sides; a metal plate-shaped electrode having two flat sides, a first one of the flat sides of the electrode being arranged on one of the flat sides of the semiconductor component so as to cover the flat side of the semiconductor component and exceed an area of the semiconductor component, the metal electrode being connected to the semiconductor component in a closed-surface, material-tight manner; an insulating substrate connected to a second of the flat sides of the metal electrode and being dimensioned to extend beyond the semiconductor component, the semiconductor component and the metal electrode being connected to the insulating substrate in a closed-surface and material-tight manner; a fluid channel; means for producing a forced cooling fluid flow in a flow direction within the fluid channel, the insulating substrate having flat sides, at least one of which is within the cooling fluid flow; a plurality of terminals attached to the other flat side of the semiconductor component in a material-tight manner at a distance from one another, whereby the semiconductor component is directly exposed over its common contact surface with the insulating substrate to cooling action of the cooling fluid flow; and a control and protection circuit operatively connected to the semiconductor component and mounted on the insulating substrate.

2. A power transistor arrangement as defined in claim 1, wherein the insulating substrate is made of an insulating material.

3. A power transistor arrangement as defined in claim 1, wherein the insulating substrate is made of a ceramic material.

4. A power transistor arrangement as defined in claim 1, wherein the insulating substrate is a metal plate having at least one flat side, and further including an insulating layer arranged on the at least one flat side of the insulating substrate.

5. A power transistor arrangement as defined in claim 4, wherein the metal plate and the metal electrode are adapted to be an integral component.

6. A power transistor arrangement as defined in claim 1, wherein the insulating substrate is arranged to have a flat side away from the semiconductor component so that the flatside is exposed to the cooling fluid flow.

7. A power transistor arrangement as defined in claim 5, wherein the semiconductor component is arranged so that its flat side away from the insulating substrate is directly exposed to the cooling fluid flow.

8. A power transistor arrangement as defined in claim 7, and further comprising a protective coating provided on the flat side of the semiconductor component that is away from the insulating substrate.

9. A power transistor arrangement as defined in claim 1, wherein the metal electrode is a metal plate having a size that substantially exceeds the size of the first flat side of the semiconductor component.

10. A power transistor arrangement as defined in claim 9, wherein the size of the metal electrode plate exceeds the size of the first flat side of the semiconductor component by at least 50%.

11. A power transistor arrangement as defined in claim 1, wherein the insulating substrate is a plate arranged and adapted to form a wall of the fluid channel.

12. A power transistor arrangement as defined in claim 11, wherein a plurality of semiconductor components are arranged on the insulating substrate one behind the other in the direction of coolant flow.

13. A power transistor arrangement as defined in claim 12, wherein a plurality of board-like insulating substrates are arranged opposite one another and adapted to form at least two walls of the fluid channel, at least one of the plurality of semiconductor components being mounted on each of the insulating substrates.

14. A power transistor arrangement as defined in claim 13, wherein an equal number of semiconductor components are arranged on the two insulating substrates.

15. A power transistor arrangement as defined in claim 14, and further comprising sealing strips arranged and adapted to connect together the insulating substrates located opposite to one another so as to form the circumferentially closed fluid channel.

16. A power transistor arrangement as defined in claim 1, wherein the insulating substrate is an insulating material supporting plate that has a continuous recess, the semiconductor component having opposite edges mounted on the support plate so that the semiconductor component covers the recess, whereby the flat side of the semiconductor component with the metal electrode is exposed through the recess to the cooling fluid flow.

17. A power transistor arrangement as defined in claim 16, wherein the insulating substrate is adapted to be part of a rectangular tube which forms the fluid channel.

18. A power transistor arrangement as defined in claim 1, wherein a plurality of semiconductor components are arranged on the insulating substrate one behind the other in the cooling fluid flow direction, each of the semiconductor components encompassing at least one power transistor.

19. A power transistor arrangement as defined in claim 18, wherein the plurality of semiconductor components are connected to one another as a single piece.

20. A power transistor arrangement as defined in claim 1, wherein the fluid channel has two walls located opposite one another, each of the walls being formed by a plurality of semiconductor components connected to one another as a single piece and arranged one behind the other in the cooling fluid flow direction, each of the semiconductor components encompassing at least one power transistor, and further comprising sealing strips which connect together the opposed semiconductor components to form the circumferentially closed fluid channel.

21. A power transistor arrangement as defined in claim 1, and further comprising closed coolant circuit means including a cooler and being connected to the fluid channel for circulating the cooling fluid through the fluid channel and the cooler.

22. A power transistor arrangement as defined in claim 21, wherein the coolant circuit means includes a vaporizer and a condenser, the fluid channel being adapted to form the vaporizer.

23. A power transistor arrangement as defined in claim 1, wherein the cooling fluid is one of a gas, a liquid and a two-phase liquid.

24. A power transistor arrangement as defined in claim 23, wherein the cooling fluid is an oil.

25. A power transistor arrangement as defined in claim 1, wherein the insulating substrate has a region exposed to the cooling fluid flow, which region has a structure that enlarges the heat exchange surface area of the insulating substrate.

26. A power transistor arrangement as defined in claim 25, wherein one of ribs and projections are provided on the insulating substrate in the region exposed to the coolant to increase the heat exchange surface.

27. A power transistor arrangement as defined in claim 1, wherein at least a portion of the surface of at least one of the insulating substrate and the semiconductor component that is exposed to the cooling fluid flow has a surface microstructure that reduces boundary layer thickness of the cooling fluid flow.

28. A power transistor arrangement as defined in claim 27, wherein the surface microstructure has a rib pattern with microribs that extend lengthwise in the cooling fluid flow direction.

29. A power transistor arrangement as defined in claim 28, wherein the microribs have side-flanks which taper to at least approximately form a blade-edge top.

30. A power transistor arrangement as defined in claim 28, wherein the microribs have a height and a cross-distance that are no greater than the boundary layer thickness of the cooling fluid flow.

31. A power transistor arrangement as defined in claim 27, wherein the surface microstructure has a multiplicity of microelevations.

32. A power transistor arrangement as defined in claim 31, wherein the microelevations are arranged in a grid.

33. A power transistor arrangement as defined in claim 31, wherein the microelevations have a polygonal form in a top view.

34. A power transistor arrangement as defined in claim 31, wherein the microelevations, in a plane running in the cooling fluid flow direction, rise vertically in a wedge-like manner.

* * * * *